United States Patent
Balakrishnan et al.

(10) Patent No.: US 10,249,780 B1
(45) Date of Patent: Apr. 2, 2019

(54) HIGH QUALITY ALSB FOR RADIATION DETECTION

(71) Applicant: STC.UNM, Albuquerque, NM (US)

(72) Inventors: Ganesh Balakrishnan, Albuquerque, NM (US); Adam Alexander Hecht, Albuquerque, NM (US); Erin Ivey Vaughan, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 0 days.

(21) Appl. No.: 15/424,464

(22) Filed: Feb. 3, 2017

Related U.S. Application Data

(60) Provisional application No. 62/290,827, filed on Feb. 3, 2016.

(51) Int. Cl.
| | | |
|---|---|---|
| H01L 21/00 | (2006.01) | |
| H01L 31/08 | (2006.01) | |
| H01L 31/18 | (2006.01) | |
| H01L 31/0304 | (2006.01) | |
| H01L 31/0216 | (2014.01) | |
| H01L 31/0392 | (2006.01) | |

(52) U.S. Cl.
CPC ...... *H01L 31/085* (2013.01); *H01L 31/02161* (2013.01); *H01L 31/0304* (2013.01); *H01L 31/03042* (2013.01); *H01L 31/0392* (2013.01); *H01L 31/184* (2013.01)

(58) Field of Classification Search
CPC ......... E04C 2/526; E04C 2/243; B32B 27/36; B32B 41/00; B32B 7/045; B32B 37/14; B32B 27/065; B32B 5/18; B32B 2325/00; B32B 2419/00; E04B 1/762; E04B 2103/04

USPC .......................................................... 438/56
See application file for complete search history.

(56) References Cited

U.S. PATENT DOCUMENTS

| | | | | |
|---|---|---|---|---|
| 7,656,912 | B2 * | 2/2010 | Brueck | B82Y 20/00 372/102 |
| 8,030,108 | B1 * | 10/2011 | Lee | B82Y 10/00 257/E21.09 |
| 8,557,622 | B2 * | 10/2013 | Lee | B82Y 10/00 257/13 |
| 8,609,461 | B1 * | 12/2013 | Balakrishnan | H01L 21/02376 257/615 |
| 9,214,581 | B2 * | 12/2015 | Khoshakhlagh | H01L 31/035236 |
| 2007/0201522 | A1 * | 8/2007 | Huffaker | B82Y 20/00 372/39 |
| 2007/0275492 | A1 * | 11/2007 | Huffaker | H01L 21/187 438/46 |
| 2008/0206966 | A1 * | 8/2008 | Huffaker | B82Y 10/00 438/479 |
| 2010/0051900 | A1 * | 3/2010 | Huffaker | B82Y 20/00 257/13 |
| 2011/0023949 | A1 * | 2/2011 | Kleiman | H01L 31/0687 136/255 |
| 2011/0065264 | A1 * | 3/2011 | Moffatt | C30B 13/24 438/487 |

(Continued)

*Primary Examiner* — Anthony Ho
*Assistant Examiner* — Mohammad M Hoque
(74) *Attorney, Agent, or Firm* — MH2 Technology Law Group, LLP

(57) ABSTRACT

Provided is a method of making a radiation detector, including: growing a thin film on a substrate. The substrate is a silicon substrate. The thin film includes aluminum antimony alloy (AlSb). The growing is epitaxial growth via ultra-high vacuum molecular beam epitaxy (UHV-MBE).

20 Claims, 2 Drawing Sheets

(56) References Cited

U.S. PATENT DOCUMENTS

| | | | |
|---|---|---|---|
| 2014/0042558 A1* | 2/2014 | Emeny | B82Y 10/00 |
| | | | 257/410 |
| 2014/0291810 A1* | 10/2014 | Bugge | H01L 21/02381 |
| | | | 257/615 |
| 2016/0211264 A1* | 7/2016 | Peng | H01L 21/8221 |
| 2016/0240536 A1* | 8/2016 | Lee | H01L 29/207 |
| 2016/0369423 A1* | 12/2016 | Fimland | H01L 21/02376 |
| 2017/0352536 A1* | 12/2017 | Bugge | H01L 21/02381 |

* cited by examiner

HIGH QUALITY ALSB FOR RADIATION DETECTION

CROSS-REFERENCE TO RELATED APPLICATIONS

This application claims priority to U.S. Provisional Patent Application Ser. No. 62/290,827, filed Feb. 3, 2016, the entirety of which is incorporated herein by reference.

GOVERNMENT RIGHTS

This disclosure was made with Government support under Contract No. 00044825 awarded by the Idaho National Laboratory National Universities Consortium. The Government has certain rights in the invention.

FIELD

This disclosure is generally directed to solid state semiconductors such as radiation detectors, in particular, to semiconductor materials for use in such detectors, and to methods of forming such semiconductor materials and detectors. Specifically, this disclosure is directed to growth of and use of high-quality aluminum-antimony alloy (AlSb) for semiconductor devices such as radiation detectors.

BACKGROUND

The properties that impact the performance of semiconductor materials, for example, in solid state radiation detectors, include high resistivity, long carrier lifetimes and good carrier mobilities, low defects, and low carrier concentration (leading to high resistivity) when the material is not exposed to radiation. For gamma radiation, the most popularly used detectors are sodium-iodide (NaI) scintillators, high-purity germanium (HPGe) semiconductors and cadmium-zinc-telluride (CZT) semiconductors. For optimal resolution, HPGe detectors must be cooled to liquid nitrogen temperatures, limiting portability and ease of use. NaI detectors are operable at room temperatures but are significantly inferior to HPGe with respect to energy resolution. The most recent addition, CdZnTe, operates at room temperature, has improved resolution (compared to NaI), but has low hole mobility, reducing it to a single charge carrier detector. This is a well-known disadvantage that results in poor spectral performance, and reduced photopeak efficiency. This also limits the detector size to maintain reasonable resolution, as an event near the cathode will have different charge collection properties than an event near the anode.

Advancements in technology involving semiconductor production introduce the possibility that new materials may be considered for use in this field. For example, ultra-high vacuum molecular-beam-epitaxy (UHV-MBE) growth eliminates many of the contaminants that are problematic for bulk growth, and also enables precise control of layer thickness and dopant concentration. However, in many instances of epitaxial growth, lattice constant mismatch and thermal expansion coefficient mismatch between the semiconductor layer and the substrate on which it is grown result in the forming of defects, particularly in thin films. What is needed in the art, therefore, is an improved method that provides for semiconductor devices that overcome the challenges associated with those of conventional semiconductor devices.

SUMMARY

In an embodiment, there is a method of making a radiation detector, comprising: growing a thin film comprising AlSb on a substrate comprising Si, wherein the growing comprises epitaxial growth via ultra-high vacuum molecular beam epitaxy (UHV-MBE).

In another embodiment there is a radiation detector, comprising: a substrate comprising Si; and a thin film disposed on the substrate, wherein the thin film comprises UHV-MBE grown AlSb.

Advantages of the embodiments include low-defect or defect free thin films comprising UHV-MBE grown AlSb disposed on silicon substrates which may be incorporated into semiconductor devices such as personal dosimeters. Additional advantages include that the AlSb thin film grown by UHV-MBE are semi-insulating and nearly defect free due to background carrier concentrations being controlled during the UHV-MBE growth process and use of a combination of predetermined growth temperatures and growth rates to prevent microcracking that otherwise could occur due to thermal expansion differences between the AlSb and Si substrate. Additional advantages of the embodiments will be set forth in part in the description which follows, and in part will be understood from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed. The accompanying drawings, which are incorporated in and constitute a part of this specification, illustrate embodiments of the invention and together with the description, serve to explain the principles of the invention.

DETAILED DESCRIPTION OF THE EMBODIMENTS

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

The following embodiments are described for illustrative purposes only with reference to the figures. Those of skill in the art will appreciate that the following description is exemplary in nature, and that various modifications to the parameters set forth herein could be made without departing from the scope of the present invention. It is intended that the specification and examples be considered as examples only. The various embodiments are not necessarily mutually exclusive, as some embodiments can be combined with one or more other embodiments to form new embodiments.

Described herein are thin films, configurations of thin films on substrates, and methods for forming such thin films on substrates. While not limited to any particular application, embodiments described herein comprising a thin film disposed on a substrate may be configured for use in semiconductor devices including detectors, for example, radiation detectors such as gamma radiation detectors, x-ray radiation detectors, and/or charged particle radiation detectors that can monitor in real time to provide. In an embodiment, the thin films grown according to methods described herein can be incorporated for use in personal dosimeters that actively monitor the environment and can generate electronic signals in response to being activated upon receiving such radiation/charged particles, for providing real-time analysis and data output of environmental conditions (e.g., "active dosimeters").

Figure 1A:
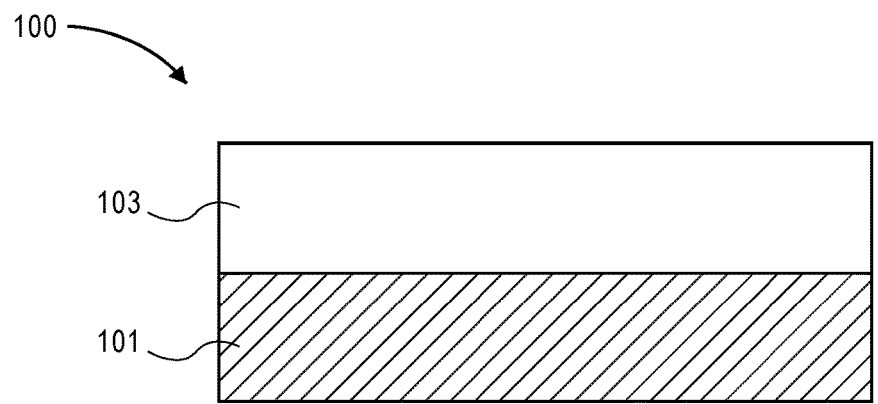
FIG. 1A illustrates a thin film disposed on a substrate according to an embodiment.
Figure 1B:
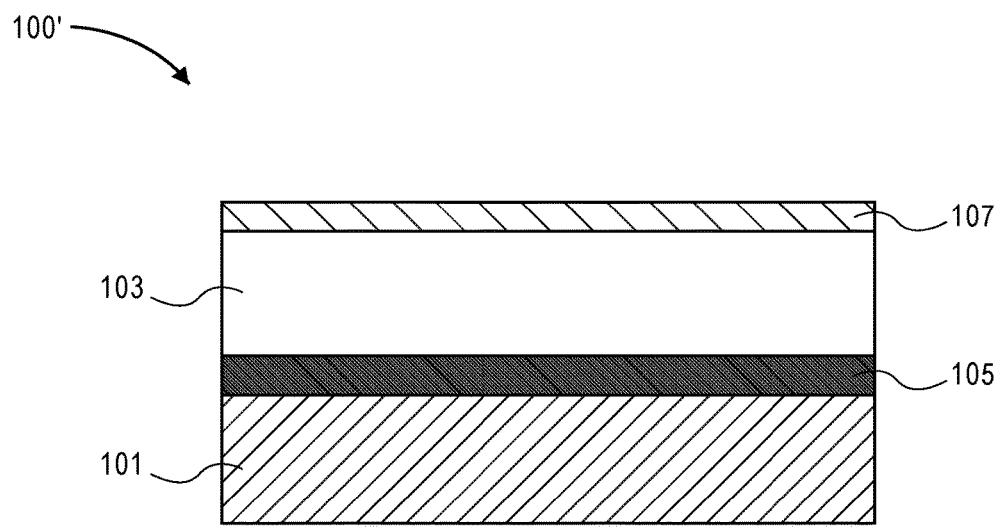
FIG. 1B illustrates the device of FIG. 1A with additional layers disposed between the thin film and the substrate, above the thin film or both, according to an embodiment.

FIG. 1A illustrates a cross-sectional view of a semiconductor device 100 of the embodiments. The semiconductor device 100 comprises a substrate 101 and a thin film 103 disposed on the substrate 101. The thin film 103 is illustrated as being disposed directly on the substrate 101. Alternatively, additional layers such as passivation layers, wetting layers (e.g. atomic layers of aluminum, i.e., aluminum flash layers) and/or other semiconductor layers may be formed over the substrate and disposed between the thin film 103 and the substrate 101. In an embodiment, at least one layer may be disposed between the substrate 101 and the thin film 103. The at least one layer may comprise a single layer or multiple layers, wherein the multiple layers may include the same or different materials in each layer. For example, in an embodiment as shown in FIG. 1B, a semiconductor device 100' additionally comprises a first layer 105 having a thickness of about 10 nm or less is disposed between the substrate 101 and the thin film 103. In an embodiment, at least one layer may be disposed over the thin film 103. The at least one layer may comprise a single layer or multiple layers, wherein the multiple layers may include the same or different materials in each layer. Alternatively, or in addition to the first layer 105, a second layer 107 having a thickness of, for example, 10 nm or less may be disposed on the thin film 103, for example, to protect thin film from exposure to oxygen. In an embodiment, the first layer may comprise an atomic layer of aluminum (i.e., an aluminum flash layer) that may be about 3 atomic layers thick. In an embodiment, the second layer 107 may comprise, for example, 5 nm of p-type GaSb. The second layer 107 may be formed by any method known in the art including via epitaxial growth methods such as UHV-MBE.

The first layer 105, substrate 103 and the second layer 107 may each be separately provided as doped or undoped layers. In an embodiment, the first layer 105 may be doped p-type and the second layer 107 may be doped n-type. For example, in an embodiment, the semiconductor device may be configured as a p-type/insulator/n-type (P-I-N) diode. Accordingly, the substrate 101 and/or first layer 105 may comprise an n-type material and the second layer 107 may comprise a p-type material. Ohmic contacts (not shown) may be applied to the thin film surfaces.

The thin film 103 may comprise a semiconductor layer. For example, the thin film 103 may comprise III-V compound semiconductor, a II-VI compound semiconductor, a group IV or other material. In an example, the semiconductor layer may comprise aluminum antimony alloy (AlSb). The thin film 103 may be engineered to be insulating or semi-insulating. For example, the thin film 103 may comprise a background carrier concentration of less than $10^{15}$ $cm^{-3}$. The background carrier concentration of the thin film 103 may be adjusted, for example, during processing. For example, as a result of preselected growth parameters, the thin film 103 may be formed p-type but may be doped with an n-type dopant in order to effectively cancel p-type carrier charge contributions.

Thin film 103 thickness can be in the range of less than 50 μm, for example less than or equal to about 5 μm, including less than or equal to about 3 μm.

The thin film 103 may be doped or undoped. While not meant to be limiting, the type and concentration of the dopant can be selected such that the thin film is semi-insulating. For example, the thin film may be doped with at least one of an n-type dopant (e.g., The n-type dopant provided to the thin film as a GaTe dopant source), a p-type dopant (e.g., Be) or both. The n-type dopant may be provided in the thin film 103 at a concentration in the range of from $8 \times 10^9$ to about $1 \times 10^{17}$ $cm^{-3}$. The p-type dopant may be provided in the thin film 103 at a concentration in the range of from about $6 \times 10^{14}$ $cm^{-3}$ to about $1 \times 10^{17}$ $cm^{-3}$. Additional parameters for the thin film 103 are described below.

The substrate may be included as a portion of a CMOS platform. In an implementation, the substrate may be a crystalline substrate. The crystalline substrate may comprise silicon (e.g., Si wafer). The substrate need not be limited by any particular material or class of material. Thus, the substrate may comprise RT/DUROID® available from Rogers Corporation of Rogers, Conn.

AlSb is difficult to produce in high quality with low defects via bulk growth methods. For example, aluminum tends to oxidize easily and Sb tends to react with crucible materials. To overcome these challenges, thin film 103 can be grown via UHV-MBE; a process which allows for very precise crystal layer composition and junctions between dissimilar materials. However, while ideal growth temperature for AlSb is from about 375° C. to about 425° C. such growth temperatures promote the formation of interstitial antimony in the alloy resulting in the semiconductor growing unintentionally doped p-type at ~$10^{16}$ $cm^{-3}$ which is not ideal for electronics applications. Higher growth temperatures can be used to offset such unintentional doping, but differences in lattice mismatch and thermal expansion coefficients between AlSb and Si result in excessive stress build up and may lead to bowing or cracking of the AlSb layer, for example, as the layers cool to room temperature after growth. Thus, growth of AlSb thin films on Si substrates is not straightforward and embodiments described herein overcome many limitations.

Figure 2:
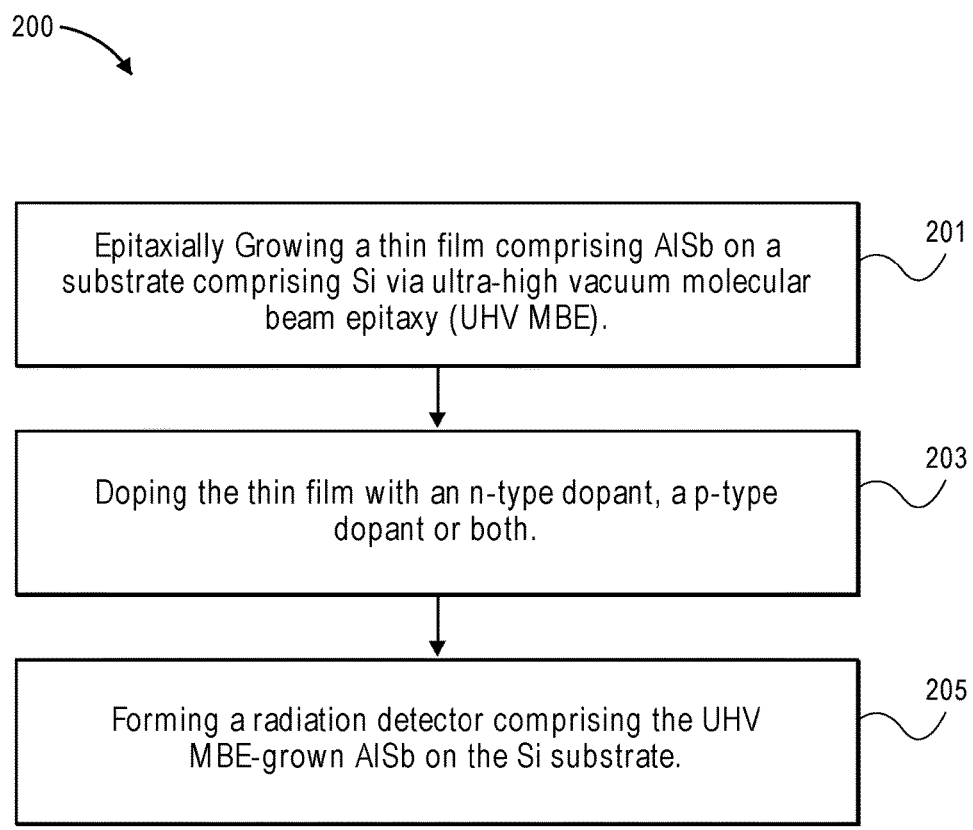
FIG. 2 is a flow chart depicting a method for growing a thin film on a substrate according to an embodiment.

For example, as illustrated in the flow chart of FIG. 2, in an embodiment, a method 200 includes growing a thin film such as thin film 103 on a substrate such as substrate 101, wherein the growing comprises epitaxial growth via UHV-MBE. The growing of the thin film at step 201 may include the epitaxial growth of AlSb via UHV-MBE on the substrate which may comprise silicon (e.g., a silicon wafer). In an embodiment, a growth temperature for growing the AlSb via UHV-MBE may be greater than 375° C., for example, greater than 425° C., including equal to or greater than 450° C. Such growth temperatures, in combination with a preselected growth rate, reduce the effect of unintentional p-type doping caused by interstitial antimony during growth as described above. Thus, in an embodiment, a growth rate for growing the AlSb may be less than or equal to about 1 µm/hr, for example, less than or equal to about 0.1 µm/hr, including a growth rate in the range of from about 0.05 µm/hr to about 0.75 µm/hr. By practice of the methods described herein, suppression of bowing, microcracks and anti-phase domains in the thin film otherwise due to thermal expansion mismatch between the AlSb and silicon substrate are realized, leading to a single domain growth of high-purity, semi-insulating AlSb.

The method may include doping the thin film with a p-type dopant, an n-type dopant, or both at step 202. In an example, the method includes doping the thin film with an n-type dopant to compensate for the unintentional doping during growth of the thin film comprising, for example, AlSb. The p-type dopant may be provided from a dopant source comprising Be. The n-type dopant may be provided from a dopant source comprising GaTe.

The doping of the thin film provides for the forming of a compensated, semi-insulating thin film. The doping may include providing a dopant concentration such that the thin film comprises less than $10^{15}$ cm$^{-3}$ background carrier concentration as measured by, for example, Van der Pauw Hall measurement. In an example, therefore, the doping provides an n-type dopant concentration in the thin film of from about $8 \times 10^9$ cm$^{-3}$ to about $1 \times 10^{17}$ cm$^{-3}$, p-type dopant concentration in the thin film of from about $6 \times 10^{14}$ cm$^{-3}$ to about $1 \times 10^{17}$ cm$^{-3}$, or both.

The thin films grown according to a method of the embodiment may be high-purity, low defect. For example, the thin film grown according to a method of an embodiment a secondary ion count for at least one contaminant of less than $10^{15}$ cm$^{-3}$ as measured by, for example, secondary ion mass spectrometry. The at least one contaminant can include oxygen.

In an embodiment, the method for growing the thin film on a substrate as described herein may further include forming a radiation detector comprising the UHV-MBE-grown AlSb on the Si substrate at step 205. In an embodiment, the method for growing the film on the substrate as described herein may further include forming at least one additional layer, for example, a first layer, on the substrate, wherein the at least one layer is disposed between the substrate and the thin film. For example, at least one atomic layer of aluminum may be formed on the substrate prior to the UHV-MBE growth of the AlSb thin film. The atomic layer of aluminum performs as a flash layer by wetting the surface of the substrate can additionally assist in the forming of high-purity, semi-insulating AlSb films. While not limited to any particular theory, it is believed that the at least one atomic layer of aluminum formed on the substrate assists in lowering the unintentional doping caused by interstitial antimony during growth.

Typical personal dosimeters record accumulated dose through thin film interactions which is read out at a later time, such as with TLD and OSL dosimeters. More active detectors are not typically used for wearable personal monitoring, which may be due to size and weight, power consumption, and price. Thin film room temperature solid state detector materials may enable this and allow for live time, networked, wearable detection. Meanwhile, thin film AlSb has a band gap similar to CZT (~1.6 eV) but can be grown directly on silicon for integration into detector circuitry. Accordingly, in an embodiment there is a personal monitoring device comprising an AlSb thin film disposed on a substrate comprising silicon, as described above. For example, the AlSb may be UHV-MBE grown AlSb as described above. Such a personal monitoring device may be configured as a radiation detector, including an active dosimeter for reporting gamma radiation, x-ray radiation and/or charged particle-radiation exposure in real time.

EXAMPLES

Example 1: UHV-MBE Growth of Aluminum Antimony Alloy (AlSb) on a Silicon Substrate A silicon wafer was prepared using a standard chemical process; e.g., rinse wafer in DI water for 1 minute, followed by 20 second immersion in dilute HF (1:20, HF:DI water), followed by 1 minute rinse in DI water. This step removes the SiO$_2$ native oxide on the silicon wafer. The oxide is replaced by H-bonds on the silicon. The hydrogen passivation is stable for ~5 minutes.

The cleaned wafer from step 1 was moved into the molecular beam epitaxy (MBE) growth chamber within a 5 minute window.

The wafer was heated to 800° C. in the growth chamber and the absence of surface oxide was confirmed by Reflective High Energy Electron Diffraction (RHEED) through the presence of a 1×2 surface reconstruction pattern.

The wafer temperature was reduced down to 450° C. The wafer temperature was confirmed by optical pyrometry.

An equivalent of 3 atomic layers of aluminum was flashed on the silicon wafer surface for form an Al flash layer.

The Al flash layer was exposed to a Sb-flux for about 2 minutes.

A thin film of AlSb was grown at a growth rate of about 0.05 µm/hr to achieve a uniform planar growth on silicon. Uniform planar growth was achieved at a thickness of 100 nm.

GaTe or Be doping was introduced depending on the desired doping level needed.

Upon completion of the AlSb growth, a thin layer of 50 Å thick GaSb was grown as a oxidation-prevention cap layer.

The wafer was cooled down to ambient temperature at the rate of 0.5° C. per minute to prevent micro-cracking.

While the present teachings have been illustrated with respect to one or more implementations, alterations and/or modifications may be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It will be appreciated that structural components and/or processing stages may be added or existing structural components and/or processing stages may be removed or modified.

Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items may be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal.

Furthermore, as used herein, the phrase "one or more of", for example, A, B, and C means any of the following: either A, B, or C alone; or combinations of two, such as A and B, B and C, and A and C; or combinations of three A, B and C.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A radiation detector, comprising:
a substrate comprising Si; and
a thin film disposed over the substrate, wherein the thin film comprises UHV-MBE grown AlSb and a background carrier concentration of less than $10^{15}$ cm$^{-3}$.

2. The detector of claim 1, wherein the thin film further comprises at least one of an n-type dopant, a p-type dopant, or both.

3. The detector of claim 2, wherein the n-type dopant comprises Te.

4. The detector of claim 2, wherein a dopant concentration of the n-type dopant in the thin film is in the range of from about $8 \times 10^9$ cm$^{-3}$ to about $1 \times 10^{17}$ cm$^{-3}$.

5. The detector of claim 2, wherein the p-type dopant comprises Be.

6. The detector of claim 2, wherein a dopant concentration of the p-type dopant in the thin film is in the range of from about $6 \times 10^{14}$ cm$^{-3}$ to about $1 \times 10^{17}$ cm$^{-3}$.

7. The detector of claim 1, wherein the thin film comprises a secondary ion count for at least one contaminant of less than $10^{15}$ cm$^{-3}$ as measured by secondary ion mass spectrometry.

8. The detector of claim 7, wherein the at least one contaminant comprises oxygen.

9. The detector of claim 1, further comprising a first layer having a thickness of about 10 nm or less disposed between the substrate and the thin film.

10. The detector of claim 1, further comprising at least one atomic layer of aluminum between the substrate and the thin film.

11. The detector of claim 1, further comprising an n-type doped layer disposed on the thin film.

12. The detector of claim 1, wherein the thin film comprises a thickness in the range of less than 50 μm.

13. The detector of claim 1, wherein the thin film comprises a thickness in the range of less than 5 μm.

14. The detector of claim 1, wherein the thin film comprises a thickness in the range of less than 3 μm.

15. The detector of claim 1, wherein the substrate is included as apportion of a CMOS platform.

16. The detector of claim 1, wherein the substrate comprises a crystalline substrate.

17. The detector of claim 1, wherein thin film comprises UHV-MBE grown AlSb that was grown at a growth temperature of between 375° C. and 425° C. and at a growth rate of from about 0.05 μm/hr to about 0.75 μm/hr.

18. The detector of claim 1, wherein the thin film comprises interstitial antimony.

19. The detector of claim 18, wherein the thin film further comprises an n-type dopant to offset p-type doping caused by the interstitial antimony.

20. The detector of claim 1, wherein the thin film comprises UHV-MBE grown, compensation-doped AlSb.

* * * * *